(12) United States Patent
Habe

(10) Patent No.: US 7,701,067 B2
(45) Date of Patent: Apr. 20, 2010

(54) METHOD FOR MANUFACTURING SEMICONDUCTOR PACKAGE CAPABLE OF POTTING THERMOSETTING RESIN WHILE BEING HEATED

(75) Inventor: Mitsunobu Habe, Sakai (JP)

(73) Assignee: NEC Electronics Corporation, Kanagawa (JP)

( * ) Notice: Subject to any disclaimer, the term of this patent is extended or adjusted under 35 U.S.C. 154(b) by 467 days.

(21) Appl. No.: 11/708,582

(22) Filed: Feb. 21, 2007

(65) Prior Publication Data

US 2007/0194461 A1    Aug. 23, 2007

(30) Foreign Application Priority Data

Feb. 22, 2006    (JP)    ............................. 2006-045682

(51) Int. Cl.
  *H01L 23/48*    (2006.01)

(52) U.S. Cl. ................. 257/777; 257/784; 257/778

(58) Field of Classification Search ................. 257/784, 257/777, 778

See application file for complete search history.

(56) References Cited

U.S. PATENT DOCUMENTS

2002/0000296 A1*  1/2002  Terada et al. ................. 156/295
2002/0004981 A1*  1/2002  Akram ........................ 29/843
2004/0046252 A1*  3/2004  Fujimori et al. ............. 257/734

FOREIGN PATENT DOCUMENTS

JP    11-097586    4/1999

* cited by examiner

*Primary Examiner*—Bradley K Smith
*Assistant Examiner*—Mohammad T Karimy
(74) *Attorney, Agent, or Firm*—Young & Thompson

(57) ABSTRACT

In an apparatus for manufacturing a semiconductor package including a semiconductor chip electronically and mechanically mounted on a tape-automated bonding tape, a resin potting unit is adapted to pot thermosetting resin into a gap between the semiconductor chip and the tape-automated bonding tape while the semiconductor chip and the tape-automated bonding tape are heated.

4 Claims, 4 Drawing Sheets

METHOD FOR MANUFACTURING SEMICONDUCTOR PACKAGE CAPABLE OF POTTING THERMOSETTING RESIN WHILE BEING HEATED

BACKGROUND OF THE INVENTION

1. Field of the Invention

The present invention relates to an apparatus and method for manufacturing a chip on film (COF) type semiconductor package including a semiconductor chip and a tape-automated bonding (TAB) tape.

2. Description of the Related Art

A first prior art method for manufacturing a COF-type semiconductor package is now explained. First, a semiconductor chip is placed face down onto a TAB tape. As a result, the semiconductor chip is electronically and mechanically connected to the TAB film. Then, the semiconductor chip and the TAB tape are mounted on a resin potting stage, so that thermosetting resin is potted from a resin potting nozzle into a gap between the semiconductor chip and the TAB tape by using the capillary phenomenon. Then, the semiconductor package is moved to a baking stage where a pre-baking operation and a post-baking operation are carried out to calcine and harden the resin. After that, an external electrode forming operation and a dicing operation are carried out, to complete the semiconductor package. This will be explained later in detail.

In the above-described first prior art manufacturing method, however, voids may be generated within the resin due to the unevenness of the TAB tape, the fluctuation of viscosity of the resin and the like, which would degrade the reliability such as the humidity resistance characteristics of the semiconductor package.

A second prior art method for manufacturing a COF-type semiconductor package is explained next (see: JP-11-97586-A). First, a semiconductor chip is also placed face down onto a TAB tape. In this case, a penetration hole is perforated in the insulating layer of the TAB tape. Then, the semiconductor chip and the TAB tape are mounted on metal molds, so that resin is potted into a gap between the semiconductor chip and the TAB tape as well as the entire front surface by using a vacuum casting process. In this case, even if voids are generated within the resin, such voids would be leaked from the penetration hole. Then, necessary operations are performed upon the semiconductor package, to complete it. This also will be explained later in detail.

SUMMARY OF THE INVENTION

In the above-described second prior art method, however, since resin may be spilled from the penetration hole, a resin potting operation is limited to a vacuum casting process using metal molds. Also, since the penetration hole needs to be formed within the TAB tape, the manufacturing cost would be increased.

According to the present invention, in an apparatus for manufacturing a semiconductor package including a semiconductor chip electronically and mechanically mounted on a TAB tape, a resin potting unit is adapted to pot thermosetting resin into a gap between the semiconductor chip and the TAB tape while the semiconductor chip and the TAB tape are heated.

Also, in a method for manufacturing a semiconductor package, a semiconductor chip is electronically and mechanically connected to a TAB tape. Then, thermosetting resin is potted into a gap between the semiconductor chip and the TAB tape while the semiconductor chip and the TAB tape are heated so that a temperature of the semiconductor chip and the TAB tape is between a resin viscosity decrease start temperature of the thermosetting resin and a baking temperature of the thermosetting resin. Then, a baking operation is performed upon the thermosetting resin by increasing the temperature of the thermosetting resin to the baking temperature.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Figure 1:
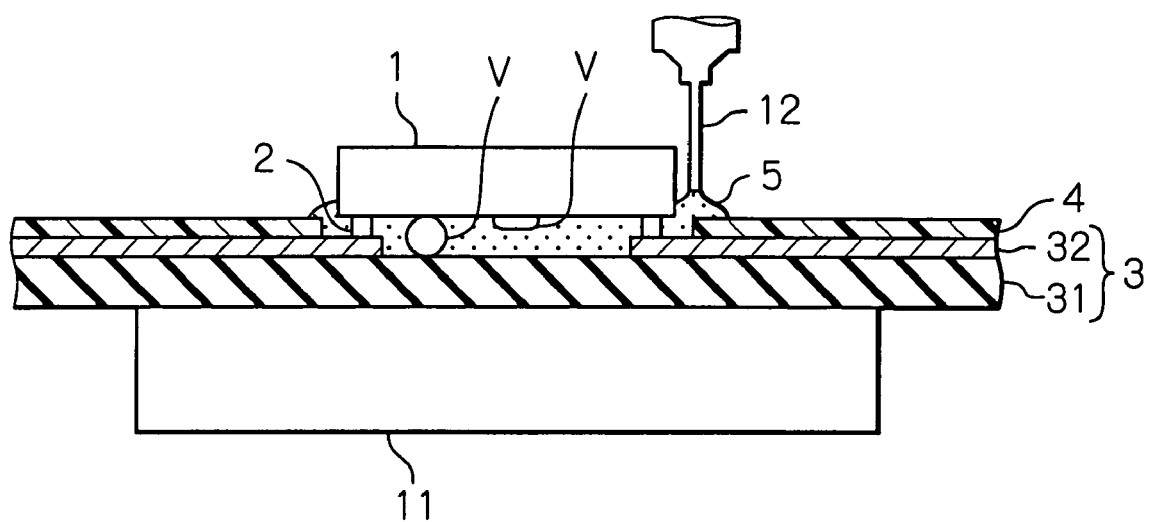
FIG. 1 is a cross-sectional view for explaining a first prior art method for manufacturing a semiconductor package.

Before the description of the preferred embodiments for manufacturing a semiconductor package will be explained.

A first prior art method for manufacturing a semiconductor package is now explained with reference to FIG. 1.

First, a semiconductor chip 1 having protruded electrodes or bumps 2 is placed face down onto a TAB tape 3 formed by an insulating film 31 made of polyimide and a wiring layer 32 coated by a solder resist layer 4. As a result, the bumps 2 are electronically and mechanically connected to the wiring layer 32 by an innerlead bonding process, an ultrasonic bonding process or a thermally-pressuring process. Then, the semiconductor chip 1 and the TAB tape 3 are mounted on a resin potting stage 11, so that thermosetting resin 5 such as epoxy resin is potted from a resin potting nozzle 12 into an about 20 to 30 µm gap between the semiconductor chip 1 and the TAB tape 3 by using the capillary phenomenon. In this case, the resin 5 is particularly called underfill resin. Then, the semiconductor package is moved to a pre-baking stage and subsequently a post-baking stage (not shown) where a pre-baking operation and a post-baking operation, respectively, are carried out to calcine and harden the resin 5. After that, an external electrode forming operation and a dicing operation are carried out, to complete the semiconductor package.

In the manufacturing method as illustrated in FIG. 1, however, voids V may be generated within the resin 5 due to the unevenness of the TAB tape 3, the fluctuation of viscosity of the resin 5 and the like, which would degrade the reliability such as the humidity resistance characteristics of the semiconductor package.

A second prior art method for manufacturing a semiconductor package is explained next with reference to FIG. 2 (see: JP-11-97586-A).

First, a semiconductor chip 1 having protruded electrodes or bumps 2 is also placed face down onto a TAB tape 3' formed by an insulating film 31' made of polyimide and a wiring layer 32. In this case, a penetration hole 31'a is perforated in the insulating layer 31'. Then, the semiconductor chip 1 and the TAB tape 3' are mounted on metal molds (not shown), so that resin 5' is potted into an about 20 to 30 μm gap between the semiconductor chip 1 and the TAB tape 3' as well as the entire front surface by using a vacuum casting process. In this case, even if voids are generated within the resin 5', such voids would be leaked from the penetration hole 31'a. Then, necessary operations are performed upon the semiconductor package, to complete it.

Figure 2:
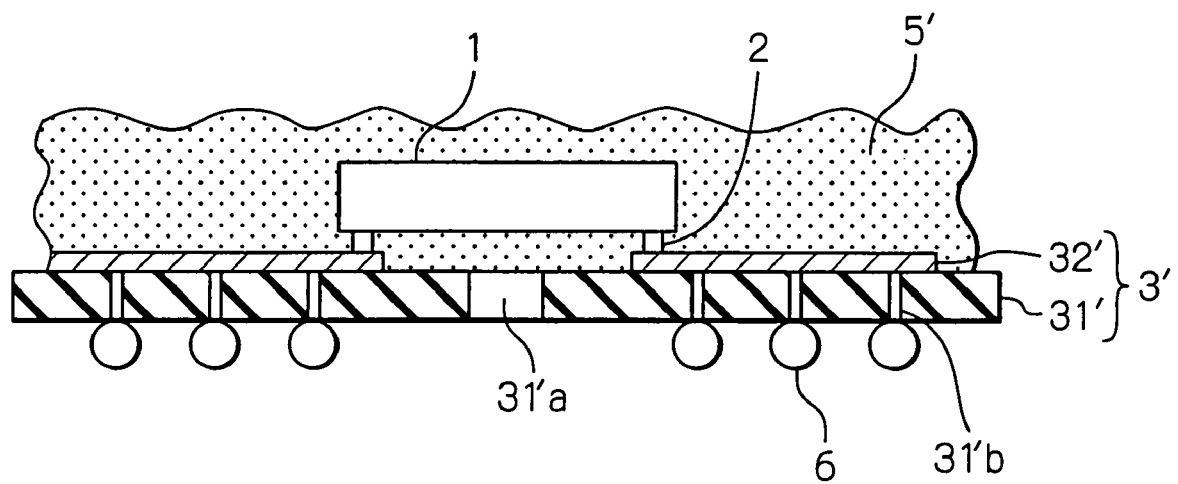
FIG. 2 is a cross-sectional view for explaining a second prior art method for manufacturing a semiconductor package.

In FIG. 2, note that reference numeral 6 designates external terminals (solder balls) and 31'b designates through holes within the insulating layer 31'.

In the method as illustrated in FIG. 2, however, since resin may be spilled from the penetration hole 31'a a resin potting operation is limited to a vacuum casting process using metal molds. Also, since the penetration hole 31'a needs to be formed within the TAB tape 3', the manufacturing cost would be increased.

A first embodiment of the method for manufacturing a semiconductor package according to the present invention is explained next with reference to FIG. 3.

First, a semiconductor chip 1 having protruded electrodes or bumps 2 is also placed face down onto a TAB tape 3 formed by an insulating film 31 made of polyimide and a wiring layer 32 coated by a solder resist layer 4. As a result, the bumps 2 are electronically and mechanically connected to the wiring layer 32 by an innerlead bonding process, an ultrasonic bonding process or a thermally-pressuring process.

In the innerlead bonding process, the bumps 2 are made of Au and the wiring layer 32 is covered with a plating Sn layer, so that Au and Sn form an eutectic mixture by a heating process using a heating tool. In this case, an ultrasonic vibration can be performed upon the semiconductor package. Also, in the thermally-pressuring process, the bumps 2 and the wiring layer 32 are made of plating Au.

Next, the semiconductor package is mounted on a resin potting unit constructed by a resin potting stage 11' including a heater 11'a and a resin injecting nozzle 12, so that the semiconductor chip 1 and the TAB tape 3 are heated by the heater 11'a for a very short time period such as about 3 seconds. As a result, thermosetting resin 5 such as epoxy resin is potted from a resin potting nozzle 12 into an about 20 to 30 μm gap between the semiconductor chip 1 and the TAB tape 3 by using the capillary phenomenon while the semiconductor chip 1 and the TAB tape 3 are heated by the heater 11'a. In this case, the temperature of the semiconductor chip 1 and the TAB tape 3 is between a resin viscosity decrease start temperature such as 50° C. and a baking temperature such as 150° C. of baking operations for the time period such as 3 seconds. The baking operations will be explained later.

The above-mentioned temperature is preferably above 60° C. in view of high fluidity of the resin 5 to completely avoid the generation of voids in the resin 5. On the other hand, the above-mentioned temperature is preferably below about 120° C. in view of a lower radiation heat to completely avoid the hardening of the resin 5 within the nozzle 12, thus increasing the life time of a resin pot (not shown) coupled to the nozzle 12.

Generally, note that the viscosity of thermosetting resin such as epoxy resin hardly decreases under room temperature. However, when the temperature is higher than 50° C., the viscosity of thermosetting resin would be decreased. In this case, the lower the temperature, the longer a low viscosity time period where the viscosity of thermosetting resin is low.

Also, since the semiconductor chip 1 and the TAB tape 3 are heated by the heater 11'a a volatile substance adhered to the semiconductor chip 1 and the TAB tape 3 can be volatilized before the potting operation of the resin 5, so that the volatile substance is hardly enclosed in the resin 5.

Further, the resin 5 is preferably a non-solvent thermosetting resin in view of no volatile substance included in the resin 5.

Then, the semiconductor package is moved from the resin potting unit to a pre-baking unit where a pre-baking operation at a temperature of about 110° C. to 130° C. is performed upon the resin 5 for about 30 minutes and then, is moved to a post-baking unit where a post-baking operation at a temperature of about 150° C. is performed upon the resin 5 for about 1.5 hours. Thus, the resin 5 is surely calcined and hardened.

Note that a resin hardening start temperature is generally lower than the baking temperature such as 110° C. That is, since a curing agent or a curing premoting agent is usually added to the resin 5, the resin 5 starts hardening at room temperature so that the resin 5 is slowly hardened in several days. Also, the resin 5 is very slowly hardened in several months even at a refrigeration temperature. Thus, the resin hardening start temperature is considered at a temperature from the refrigeration temperature to room temperature and is much lower than the baking temperature. Therefore, even when the temperature of the resin 5 is between the resin viscosity decrease start temperature such as 50° C. and the baking temperature such as 110° C., the resin 5 starts hardening, however, since the semiconductor package is mounted on the resin potting unit for a very short time period such as about 3 seconds, the hardening of the resin 5 on the resin potting unit can be neglected.

Note that the above-described pre-baking and post-baking operations can be a single baking operation.

Finally, an external electrode forming operation and a dicing operation are carried out to complete the semiconductor package.

A second embodiment of the method for manufacturing a semiconductor package according to the present invention is explained next with reference to FIG. 4.

Figure 3:
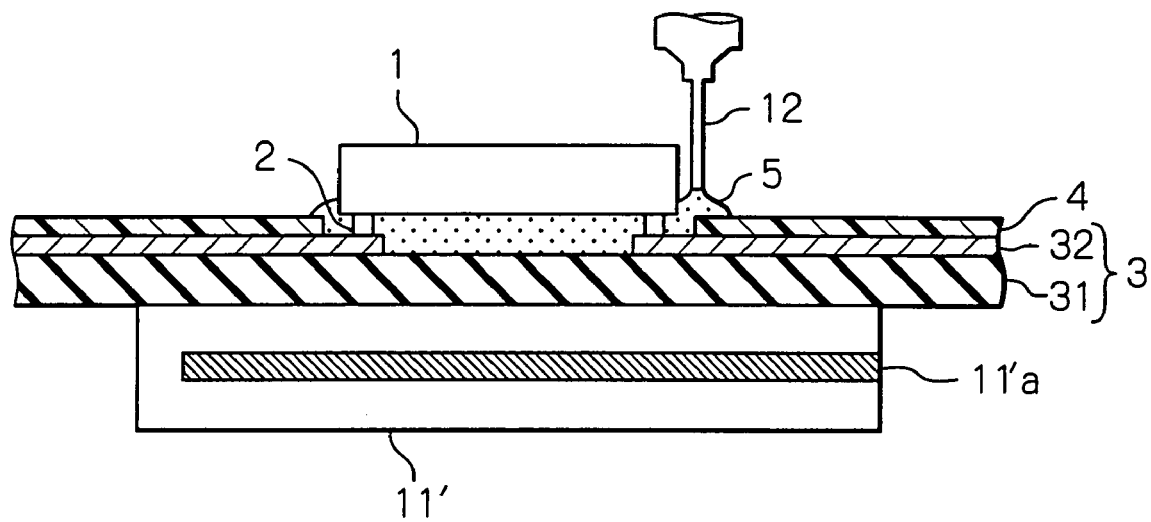
FIG. 3 is a cross-sectional view for explaining a first embodiment of the method for manufacturing a semiconductor package according to the present invention.
Figure 4:
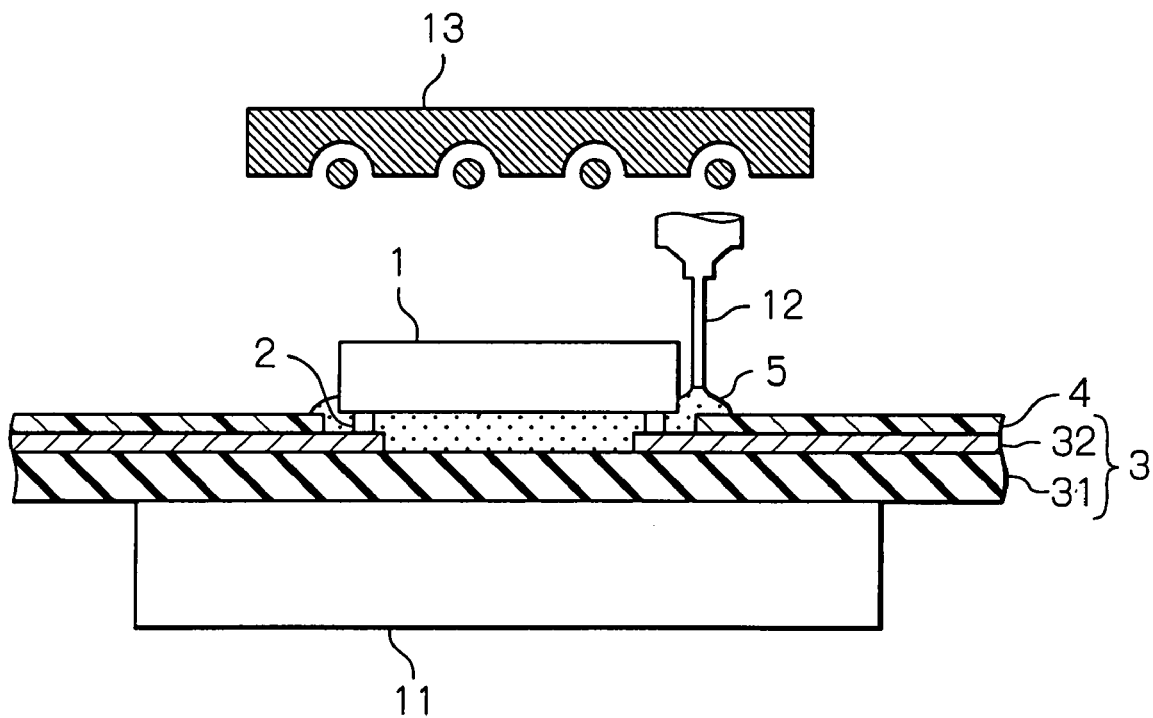
FIG. 4 is a cross-sectional view for explaining a second embodiment of the method for manufacturing a semiconductor package according to the present invention.

In FIG. 4, the resin potting unit of FIG. 3 is replaced by a resin potting unit constructed by a resin potting stage 11 including no heater, a resin potting nozzle 12 and an infrared ray lamp 13. The infrared ray lamp 13 rather the heater 11'a of FIG. 3 can locally heat the semiconductor chip 1 and the TAB tape 3.

A third embodiment of the method for manufacturing a semiconductor package according to the present invention is explained next with reference to FIG. 5.

Figure 5:
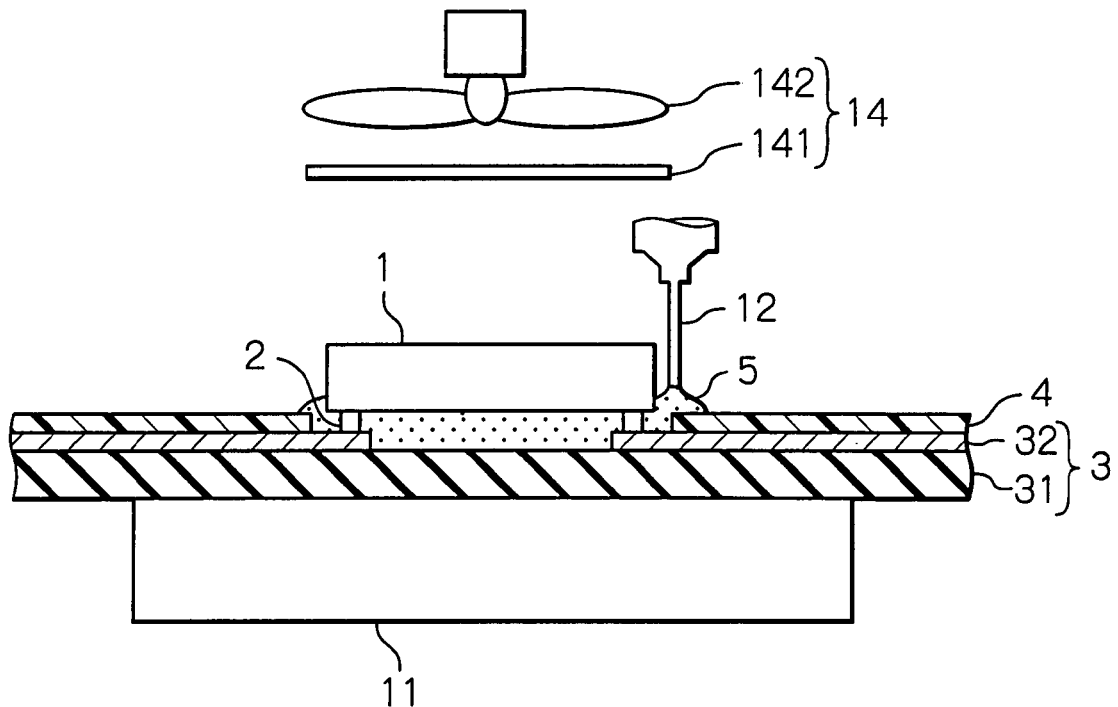
FIG. 5 is a cross-sectional view for explaining a third embodiment of the method for manufacturing a semiconductor package according to the present invention.

In FIG. 5, the resin potting unit of FIG. 3 is replaced by a resin potting unit constructed by a resin potting stage 11 including no heater, a resin potting nozzle 12 and a heat gun 14. The heat gun 14 is formed by a heater 141 and an air fan 142. The heat gun 14 rather the heater 11'a of FIG. 3 can locally heat the semiconductor chip 1 and the TAB tape 3.

A fourth embodiment of the method for manufacturing a semiconductor package according to the present invention is explained next with reference to FIG. 6.

Figure 6:
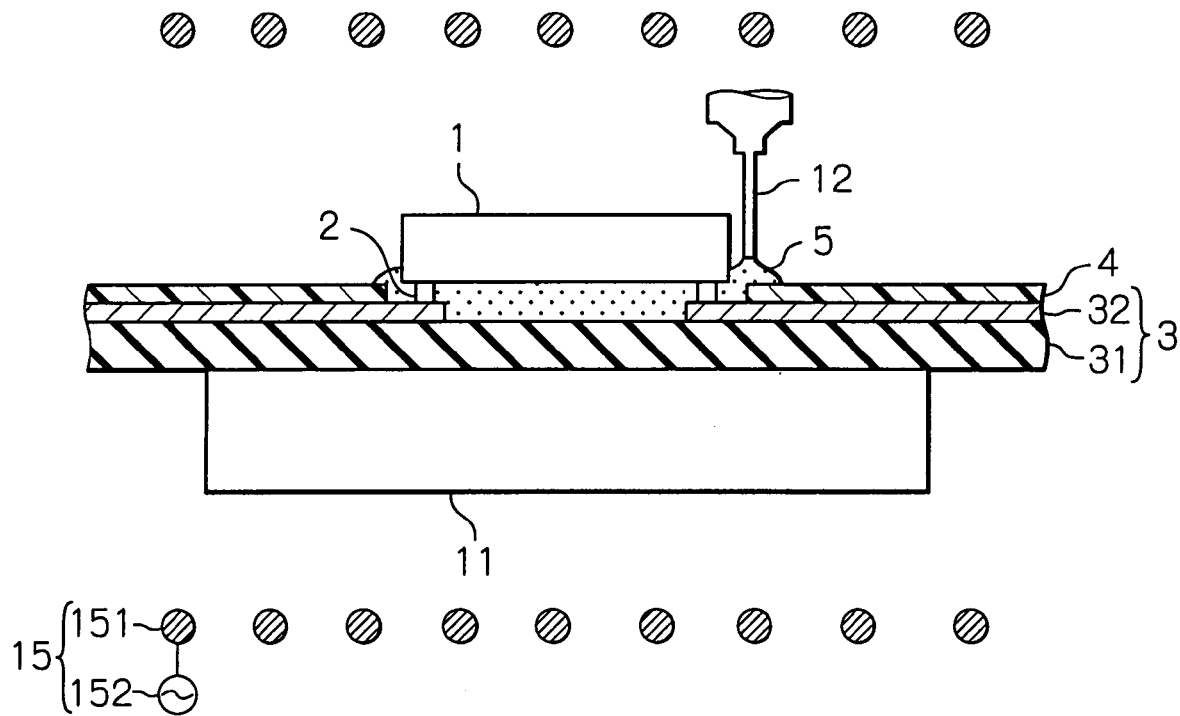
FIG. 6 is a cross-sectional view for explaining a fourth embodiment of the method for manufacturing a semiconductor package according to the present invention.

In FIG. 6, the resin potting unit of FIG. 3 is replaced by a resin potting unit constructed by a resin potting stage 11 including no heater, a resin potting nozzle 12 and a high frequency heater 15. The high frequency heater 15 is formed by a winding 151 and a high frequency oscillator 152. The high frequency heater 15 rather the heater 11'a of FIG. 3 can locally heat the semiconductor chip 1 and the TAB tape 3.

Figure 7A:
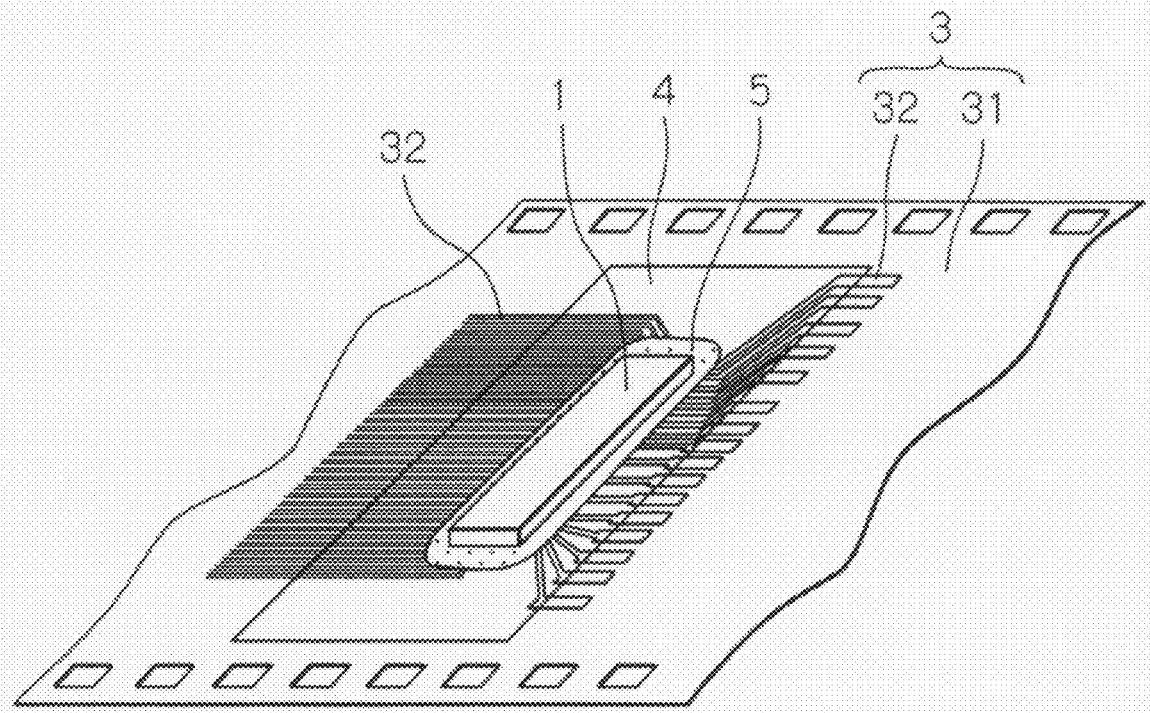
FIGS. 7A and 7B are perspective views of the completed semiconductor package of 3, 4, 5 or 6.
Figure 7B:
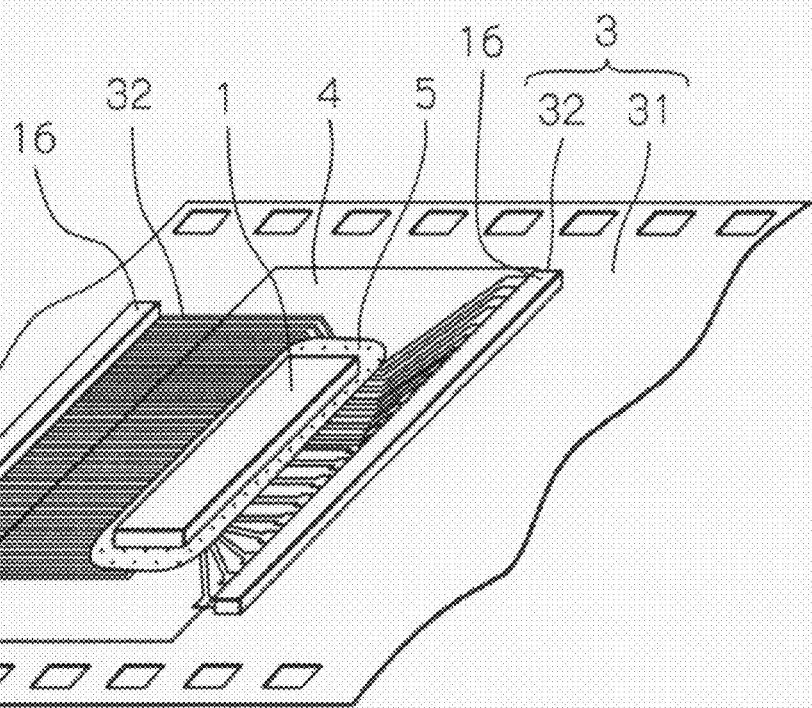

Note that the semiconductor package of FIG. 3, 4, 5 or 6 after the baking operations is illustrated in FIG. 7A, and the semiconductor package of FIG. 3, 4, 5 or 6 after the external electrode forming operation is illustrated in FIG. 7B where external electrodes 16 are made of anistropic conductive rubber.

The invention claimed is:

1. A method for manufacturing a semiconductor package, comprising, in order:
   electronically and mechanically connecting a semiconductor chip to a tape-automated bonding tape;
   potting thermosetting resin into a gap between said semiconductor chip and said tape-automated bonding tape while said semiconductor chip and said tape-automated bonding tape are at a first temperature above a resin viscosity decrease start temperature of said thermosetting resin and less than a second temperature at which said thermosetting resin is calcined and hardened; and
   performing a baking operation upon said thermosetting resin by increasing a temperature of said thermosetting resin to said second temperature.

2. The method as set forth in claim 1, wherein said first temperature is between about 60° C. and 120° C.

3. The method as set forth in claim 1, wherein said thermosetting resin is a non-solvent thermosetting resin.

4. The method as set forth in claim 1, wherein said semiconductor chip and said tape-automated bonding tape are heated to said first temperature for no more than about 3 seconds.

* * * * *